United States Patent
Brezoczky et al.

(10) Patent No.: US 6,241,477 B1
(45) Date of Patent: Jun. 5, 2001

(54) IN-SITU GETTER IN PROCESS CAVITY OF PROCESSING CHAMBER

(75) Inventors: Thomas Brezoczky, San Jose; Roger Heyder, Los Altos; Robert E. Davenport, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/383,119

(22) Filed: Aug. 25, 1999

(51) Int. Cl.$^7$ .................................................. F04B 37/02
(52) U.S. Cl. .................................. 417/48; 417/51; 417/49
(58) Field of Search .............................. 417/48, 49, 51; 204/192.1, 298.01

(56) References Cited

U.S. PATENT DOCUMENTS

| | | |
|---|---|---|
| 3,996,488 | 12/1976 | Zucchinelli . |
| 4,132,614 | * 1/1979 | Cuomo et al. .................. 204/298.01 |
| 5,324,172 | 6/1994 | Manini et al. . |
| 5,685,963 | * 11/1997 | Lorimer et al. .................. 204/298.03 |
| 5,911,560 | * 6/1999 | Krueger et al. ........................ 417/51 |

FOREIGN PATENT DOCUMENTS 1-200071 * 8/1989 (JP) ........................................ 417/48

* cited by examiner

Primary Examiner—Cheryl J. Tyler
(74) Attorney, Agent, or Firm—Thomason. Moser & Patterson, LLP

(57) ABSTRACT

An apparatus for removing an undesirable gas in a processing chamber includes one or more getter materials disposed between a process gas inlet and a substrate support member in the processing chamber, and one or more temperature control elements disposed in thermal communication with the one or more getter materials. Preferably, a controller is connected to the one or more temperature control elements to regulate the temperature of the one or more getter materials, and a gas analyzer is disposed within the processing chamber to provide signals to the controller and indicate the presence of undesirable gases. Another aspect of the invention provides a method for removing a gas from a processing chamber comprising pumping the gas using a getter material disposed between a process gas inlet and a substrate support member in the processing chamber, wherein the getter material is activated by a temperature control element disposed in thermal communication with the getter material. Preferably, the method further comprises detecting a presence of the gas within the processing chamber and controlling the pumping of the getter material based on detection of the presence of the gas.

18 Claims, 2 Drawing Sheets

IN-SITU GETTER IN PROCESS CAVITY OF PROCESSING CHAMBER

BACKGROUND OF THE INVENTION

1. Field of the Invention

The present invention generally relates to a vacuum processing chamber. More particularly, the present invention relates to an apparatus comprising getter material for removing undesirable gases in a processing chamber.

2. Background of the Related Art

Substrate processing is usually carried out in vacuum processing chambers, such as physical vapor deposition (PVD) chambers, chemical vapor deposition (CVD) chambers and etch chambers. These vacuum processing chambers typically require high vacuum levels on the order of a few milliTorr to ultra high vacuum levels on the order of $10^{-9}$ Torr. Several pumps are usually connected in series or in parallel to the chamber exhaust to achieve the ultra high vacuum levels within a chamber. High pressure pumps, such as mechanical pumps, are often used first to reduce the pressure within the chamber to high vacuum levels of less than 1 Torr. Low pressure pumps, including molecular pumps, ion pumps, cryopumps, turbo pumps, and other vacuum pumps, are then used to reduce the pressure to ultra high vacuum levels. The pump-down time for a particular chamber can range from a few minutes to hours to days depending upon such factors as the size of the chamber, the capacity of the pumps, the conductance from the chamber to the pumps and the desired final vacuum level.

Getter pumps have been used in conjunction with other pumps to achieve high or ultra high vacuum levels. A getter pump generally includes a getter material (i.e., a metal alloy) which has an affinity for certain gases and is typically encased in a pump housing attached to the chamber. Getter materials can preferentially adsorb certain gases, but typically not the noble gases, depending upon the composition and the operating temperature of the getter material. U.S. Pat. No. 5,238,469, hereby incorporated by reference in its entirety, describes getter materials used for preferentially adsorbing selected gases. While many gases may cause undesirable depositions in semiconductor devices that change, for example, the resistivity, uniformity, stress, and reflectivity of the deposited films, oxygen and its various compounds appear to be primary causes of contamination during substrate processing. Other typical contaminant gases include water vapor and hydrogen. The contaminant gases are typically introduced into the processing chamber along with the process gases through the process gas inlets and/or manifolds. Another source of contaminate gases is the substrate itself, in which the contaminate gases are released or desorbed from the substrate in the processing chamber. The contaminant gases may form oxides on the substrate surface and on the surfaces of other components exposed to the process cavity. For example, in a PVD chamber, the contaminant gases may cause formation of oxides on the metal target surfaces, such as aluminum oxide on an aluminum target, resulting in unsatisfactory deposition and defect formations on the substrate.

Getter pumps can be configured to selectively adsorb the particular contaminant gases. Typically, a getter pump is attached externally to a vacuum processing chamber. U.S. Pat. No. 5,324,172, by Manini et al., entitled "High Capacity Getter," which is hereby incorporated by reference in its entirety, describes an external getter pump and a variety of getter materials that can be used with the getter pump. The getter pump described by the '172 patent is attached externally to the process chamber, and the effectiveness of the getter pump is restricted by the conductance between the getter pump and the chamber interior. Typically, the conductance between the getter pump and the chamber interior is controlled by the size of the chamber outlet and the getter pump inlet. Because of the physical location of the getter pump and the conductance limitation, the '172 getter pump is inefficient in removing undesirable gases from the process chamber. Furthermore, the '172 getter pump is unable to prevent the undesirable gases from contaminating the substrate surface during the deposition process because the '172 getter pump removes the undesirable gases from a location outside of the process cavity, after the substrate and other surfaces of the chamber components have already been exposed to the undesirable gases.

To address some of the problems encountered in using an external getter pumps, U.S. Pat. No. 5,685,963, Lorimer et al., describes a wafer processing system having a getter pump disposed inside a processing chamber for pumping an undesirable gas within the processing chamber. The processing system also includes a low pressure pump attached externally to the process chamber capable of maintaining a desired processing pressure within the processing chamber. The '963 getter pump is disposed within the processing chamber to adsorb an undesirable gas during processing and to eliminate the conductance problems experienced with externally attached getter pumps. Although the '963 getter pump provides better adsorption of undesirable gases than an external getter pump because the '963 getter pump is located within the processing chamber, the '963 getter pump still does not prevent the undesirable gases from reaching and contaminating the substrate surface and other chamber component surfaces, such as a target surface, during processing. The undesirable gases are still able to travel to the substrate surface and other chamber component surfaces, without first encountering the '963 getter pump, thereby contaminating these surfaces during the deposition process and cause defect formations on the substrate. Furthermore, because the '963 getter pump is bulky in construction, a larger internal chamber space is required to accommodate the '963 getter pump, resulting in a longer pump-down time.

Therefore, there remains a need for a substrate processing system that prevents the undesirable gases from contaminating the substrate deposition surface and surfaces of chamber components. Particularly, there is a need for an in-situ getter that reduces the undesirable gases from the process cavity and improves the properties of the deposited film by reducing the substrate surface contamination from undesirable gases during processing.

SUMMARY OF THE INVENTION

The invention generally provides a substrate processing system that prevents the undesirable gases from contaminating the substrate deposition surface. Particularly, the invention provides an in-situ getter that reduces or removes the undesirable gases from the process cavity above the substrate surface, and improves the properties of the deposited film by reducing the substrate surface contamination from undesirable gases during processing.

In one aspect, the invention provides an apparatus for removing an undesirable gas in a processing chamber comprising one or more getter materials disposed between a process gas inlet and a substrate support member in the processing chamber, and one or more temperature control elements disposed in thermal communication with the one or more getter materials. Preferably, a controller is connected to the one or more temperature control elements to regulate the temperature of the one or more getter materials, and a gas analyzer is disposed within the processing chamber to provide signals to the controller and indicate the presence of undesirable gases. Preferably, the one or more getter materials are disposed on an inner surface of a shield disposed within the processing chamber, and more preferably, the one or more getter materials are disposed in a dark space region between the shield and a target within the processing chamber.

In another aspect, the invention provides an apparatus for processing a substrate, comprising: a vacuum processing chamber; a substrate support member disposed in the chamber; a gas inlet connected to the chamber; a gas exhaust connected to the chamber; one or more getter materials disposed between the gas inlet and the substrate support member in the processing chamber; and one or more temperature control elements disposed in thermal communication with the one or more getter materials.

Another aspect of the invention provides a method for removing a gas from a processing chamber comprising pumping the gas using a getter material disposed between a process gas inlet and a substrate support member in the processing chamber, wherein the getter material is activated by a temperature control element disposed in thermal communication with the getter material. Preferably, the method further comprises detecting a presence of the gas within the processing chamber and controlling the pumping of the getter material based on detection of the presence of the a gas. By removing or reducing the undesirable gases from the processing chamber, the invention reduces contamination of the deposited film by the undesirable gases, and the properties of the deposited film are improved.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
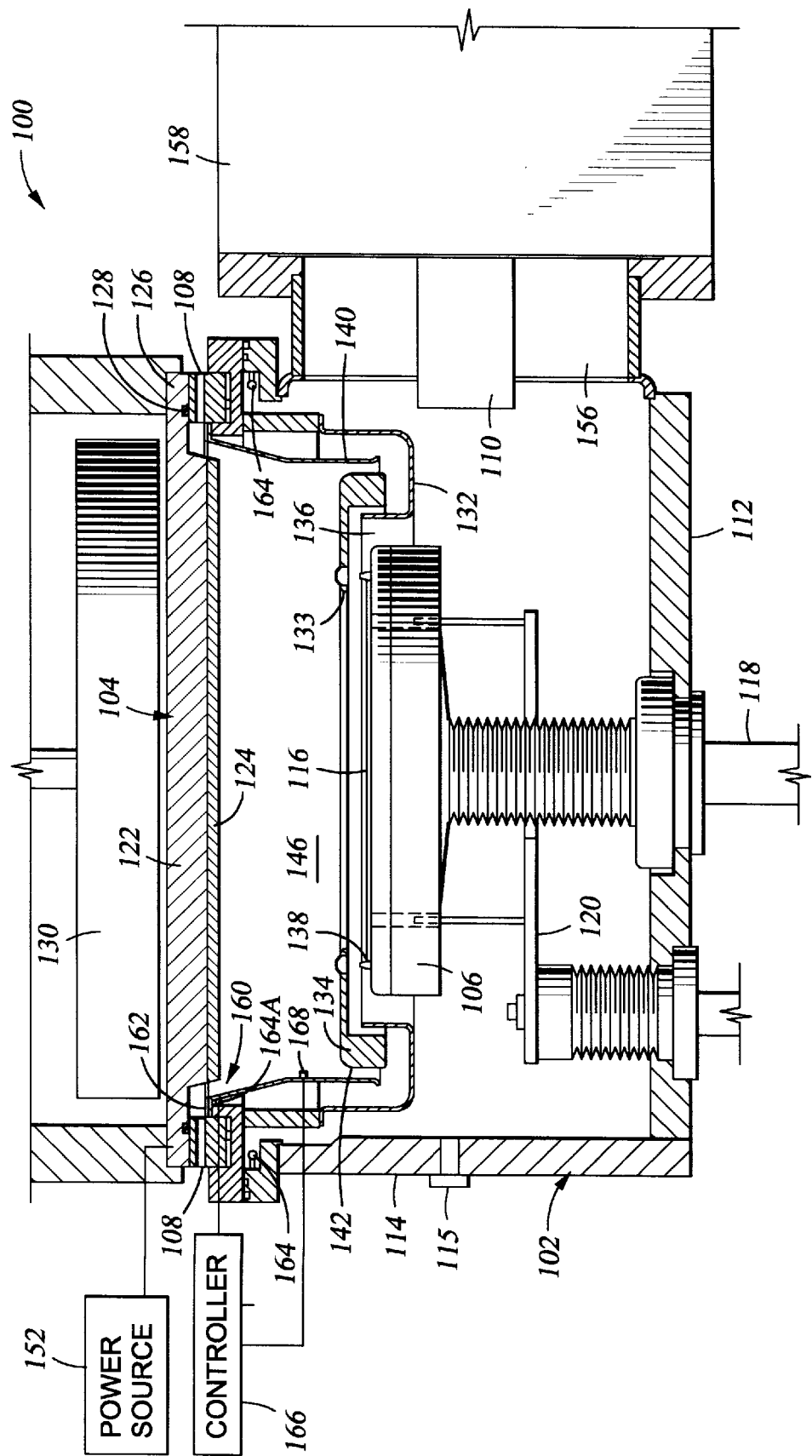
FIG. 1 is a cross sectional view of a physical vapor deposition chamber having an in-situ getter according to the invention.

FIG. 1 is a cross sectional view of a physical vapor deposition chamber having an in-situ getter according to the invention disposed therein. Although the invention is described with respect to a PVD chamber, the invention is applicable to other substrate processing systems, including chemical vapor deposition systems and etching systems. The PVD chamber 100 generally comprises a chamber enclosure 102, a target 104, a substrate support 106, a gas inlet 108 and a gas exhaust 110. The chamber enclosure 102 includes a chamber bottom 112 and a chamber side wall 114. A slit valve 115 is disposed on a chamber side wall 114 to facilitate transfer of a substrate 116 into and out of the PVD chamber 100. The substrate support 106 is disposed on a substrate support lift assembly 118 through the chamber bottom 112. Typically, a temperature control element (not shown), such as a resistive heater, is incorporated within the substrate support 106 to control the temperature of the substrate 116 during processing. Preferably, the substrate support 106 is made of stainless steel, and the temperature control element comprises a platinum/rhodium heater coil. The substrate support lift assembly 118 moves the substrate support 106 vertically between a substrate transfer position and a substrate processing position. A lift pin assembly 120 lifts the substrate 116 off the substrate support 106 to facilitate transfer of the substrate 116 between the chamber and a robot blade (not shown) used to transfer the substrate into and out of the chamber.

The target 104 is disposed in the top portion of the chamber enclosure 102. Preferably, the target 104 is positioned directly above the substrate support 106. The target 104 generally comprises a backing plate 122 supporting a plate of sputterable material 124. Typical target materials include copper, titanium, aluminum and other metals used for forming the deposited films. The target material may also include combinations of these metals as well as other materials used for other PVD processes, such as reactive sputtering, wherein the sputtered material reacts with other materials or gases in the process cavity to form the deposited film. The backing plate 122 includes a flange portion 126 that is secured to the chamber enclosure 102. Preferably, a seal 128, such as an O-ring, is provided between the flange portion 126 of the backing plate 122 and the chamber enclosure 102 to establish and maintain a vacuum environment in the chamber during processing. A magnet assembly 130 is disposed above the backing plate 122 to provide magnetic field enhancement that attracts ions from the plasma toward the target sputtering surface to enhance sputtering of the target material.

A lower shield 132 is disposed at the top portion of the chamber to shield the interior surfaces of the chamber enclosure 102 from deposition. The lower shield 132 extends from an upper portion of the chamber side wall 114 to a peripheral edge of the substrate support 106 in the processing position. Preferably, a clamp ring 134 is removably disposed on an inner terminus 136 of the lower shield 132 to clamp and shield a peripheral portion of the substrate during processing. When the substrate support 106 moves into the processing position, the inner terminus 136 surrounds the substrate support 106, and a peripheral portion 138 of the substrate 116 engages an inner terminus 133 of the clamp ring 134 and lifts the clamp ring 134 off the inner terminus 136 of the lower shield 132. The clamp ring 134 serves to clamp or hold the substrate 116 as well as shield the peripheral portion 138 of the substrate 116 during the deposition process. Alternatively, instead of a clamp ring 134, a shield cover ring (not shown) is disposed above an inner terminus of the lower shield. When the substrate support moves into the processing position, the inner terminus of the shield cover ring is positioned immediately above the peripheral portion of the substrate to shield the peripheral portion of the substrate from deposition.

An upper shield 140 is disposed within an upper portion of the lower shield 132 and extends from the upper portion of the chamber side wall 114 to a peripheral edge 142 of the clamp ring 134. Preferably, the upper shield 140 comprises a material similar to the materials that comprise the target, such as aluminum and other metals. The upper shield 140 preferably has a floating potential with respect to ground that provides an increased ionization of the plasma compared to a grounded upper shield. The increased ionization provides more ions to impact the target 104 leading to a greater deposition rate because of the increased sputtering from the target 104. Alternatively, the upper shield 140 can be grounded during the deposition process.

A gas inlet 108, preferably disposed at the top portion of the chamber enclosure 102 between the target 104 and the upper shield 140, introduces a processing gas into a process cavity 146. The process cavity 146 is defined by the target 104, the substrate 116 disposed on the substrate support 106 in the processing position and the upper shield 140. Typically, argon is introduced through the gas inlet 108 as the process gas source for the plasma.

To supply a bias to the target 104, a power source 152 is electrically connected to the target 104. In a typical arrangement, the power source negatively biases the target, so that the target becomes a cathode. The power source 152 may include an RF generator and an RF matching network coupled to the target 104. The power source 152 supplies the energy to the process cavity to strike and maintain a plasma of the processing gas in the process cavity during the deposition process.

A gas exhaust 110 is disposed on the chamber side wall 114 to evacuate the chamber prior to the deposition process, as well as control the chamber pressure during the deposition process. Preferably, the gas exhaust 110 includes an exhaust valve 156 and an exhaust pump 158. The exhaust valve 156 controls the conductance between the interior of the chamber 100 and the exhaust pump 158. The exhaust pump 158 preferably comprises a turbomolecular pump in conjunction with a cryopump to minimize the pump down time of the chamber. Alternatively, the exhaust pump 158 comprises a low pressure, a high pressure pump or a combination of low pressure and high pressure pumps.

According to the invention, an in-situ getter 160 is disposed on an upper portion of the upper shield 140. Preferably, the getter 160 is disposed in the dark space region (i.e., the region between the upper shield 140 and the edge portion of the target 104) because the plasma generated during processing typically does not enter the dark space to cause sputtering in this region. Thus, the surface of the getter 160 does not become covered by deposition from the sputtering process, and the getter 160 is able to adsorb the undesirable gases during wafer processing. The getter 160 is preferably disposed around an upper portion of the process cavity 146 in the processing chamber. In a preferred embodiment as shown in the PVD chamber in FIG. 1, the getter 160 is disposed in a dark space region surrounding the edge of the target. At this location, a very small amount of sputtered material is deposited on the getter material surfaces due to the relative absence of the plasma glow discharge in the dark space region between the edge of the target and an upper portion of the upper shield. This location allows the getter to function for an extended time period without becoming coated with deposition material from the sputtering process.

Figure 2:
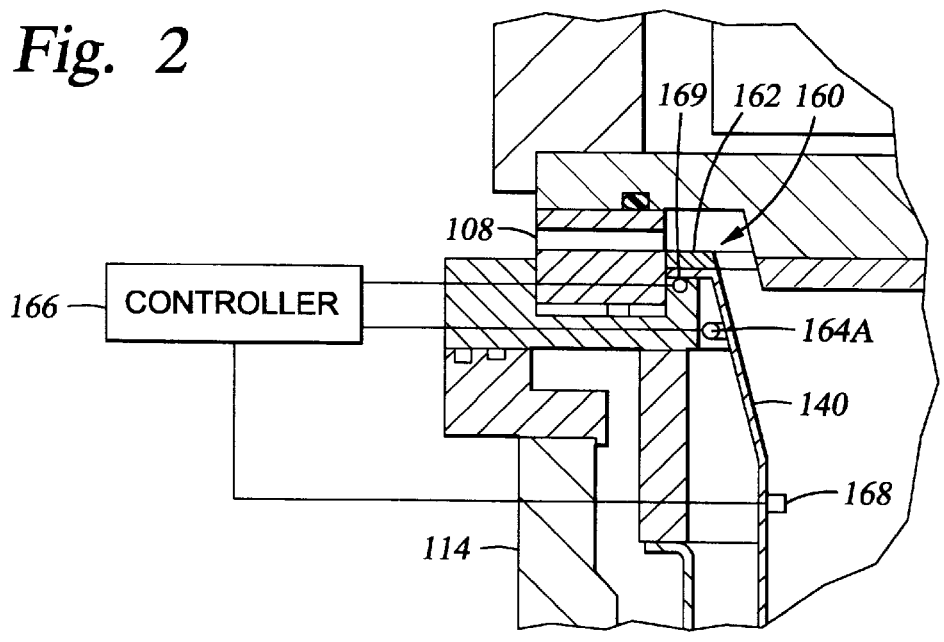
FIG. 2 is a detailed partial cross sectional view of an embodiment of the invention.

The in-situ getter 160 generally comprises a getter material 162 disposed on an interior surface of the upper shield 140 exposed to the dark space region between the target and the upper shield. Preferably, the getter material 162 comprises a bulk getter such as titanium, zirconium, tantalum, thorium, columbium, and alloys such as cerium-misch metal-aluminum-thorium, zirconium-aluminum, zirconium-aluminum-nickel and zirconium titanium, because the adsorption limiting capacity of bulk getter usually depends on the mass of the getter instead of the surface area. In one preferred embodiment, the getter material 162 comprises a coating deposited on an inner surface of the upper shield 140. Preferably, the getter material 162 covers an upper portion of the upper shield 140 that is exposed to the dark space region between the target 104 and the upper shield 140. Preferably, a gap remains between the getter material 162 on the upper shield 140 and the target 104 in the dark space region. Preferably, the getter material 162 has sufficient mass or thickness that provides adsorption of the contaminant gases for at least the useful life of the target or the useful life of the process kit (particularly the useful life of the upper shield). For example, for a 14-inch diameter shield, the getter material 162 comprises a one-inch band coating having a thickness between about 0.1 mm and about 2 mm. The thickness of the getter material 162 can be greater than 2 mm, where the physical dimensions of the dark space region permits, to provide greater mass and capacity for adsorbing the undesirable gases. In another embodiment, as shown in FIG. 2, the position of the upper shield 140 is shifted lower (away from the target) to provide additional space to accommodate getter material having greater thickness. Thus, the getter 160 can provide a greater adsorption capacity. For example, the position of the upper shield 140 can be lowered about 5 mm to accommodate a coating of getter material 162 having about 5 mm thickness. Although the invention has been described in relation to an upper shield, the invention contemplates applications in chambers having one shield. The invention contemplates a variety of shapes and thickness of the getter material to tailor to specific needs of a chamber.

Preferably, a temperature control element 164 is disposed in thermally communication with the getter material 162 to activate the getter material 162 for selective adsorption of undesirable gases. Preferably, the temperature control element 164 comprises a plurality of heat lamps disposed between the chamber sidewall 114 and the upper shield 140 to radiate heat to the getter material 162. The heat lamps are preferably positioned substantially equally around an upper portion of the upper shield 140 to uniformly heat the getter material 162. The heat lamps are secured by fasteners to the chamber sidewalls and transfer heat to the outer surface of the upper shield 140, which in turn increase the temperature of the getter material 162. Alternatively, the temperature control element 164A comprises a heating element ring disposed in thermal communication with a back surface of the upper shield 140. The heating element ring preferably comprises a resistive heater that changes temperature with respect to the electrical power (voltage or current) applied to the heating element ring and is secured by one or more fasteners to the chamber sidewall. A variety of shapes, elements, and orientations for the getter 160 and the temperature control element 164 are contemplated by the inventors according to the invention. The temperature control element 164 can also be used to heat the getter material to a regeneration temperature that releases adsorbed gases from the getter material. Regeneration of the getter material may be performed along with a chamber cleaning or bake-out process.

Preferably, a controller 166, such as a microprocessor, is connected to the temperature control element 164 to regulate the operational temperature of the getter material 162. Preferably, a temperature sensor 169 is disposed adjacent the getter material 162 or the back surface of the upper shield 140 to provide temperature measurements of the getter material 162. The controller 166 regulates the temperature of the getter material 162 by activating or deactivating the temperature control element 164 according to the temperature measurements provided by the temperature sensor 169. Alternatively, the controller 166 regulates the temperature of the getter material 162 by activating and deactivating the temperature control element 164 according to a predetermined program.

A gas analyzer 168 is preferably disposed within the process cavity 146 (shown in FIG. 1) to detect the presence of certain gases, particularly undesirable gases. The gas analyzer 168, preferably comprising a standard residual gas analyzer (RGA), is connected to the controller 166 and provides signals to the controller 166 to indicate the presence of certain undesirable gases. For example, when the gas analyzer 168 detects the presence of hydrogen in the process cavity, the gas analyzer 168 sends a signal to the controller 166 to indicate the presence of hydrogen. The controller 166 then responds by changing the temperature of the getter material 162 using the temperature control element 164 to a temperature that causes the getter material 162 to adsorb hydrogen.

Figure 3:
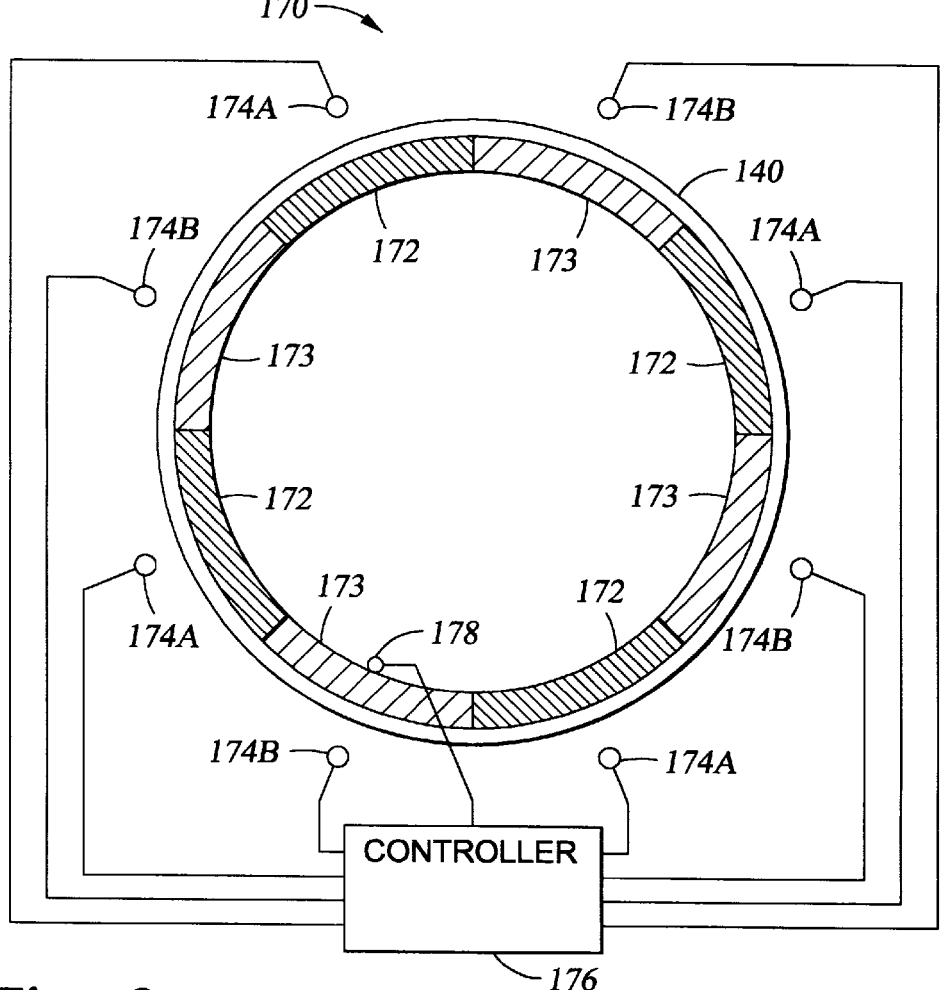
FIG. 3 is a top schematic view of an alternative embodiment of the invention having a plurality of getter materials.

FIG. 3 is a top schematic view of an alternative embodiment of an in-situ getter according to the invention. In this alternative embodiment, the getter 170 comprises a plurality of getter materials and one or more temperature control elements disposed in thermal communication with the getter materials. Preferably, the plurality of getter materials comprise two or more getter materials 172, 173 disposed in an alternating arrangement on an upper portion of the upper shield 140, preferably in an evenly distributed pattern to provide uniform adsorption of undesirable gases within the chamber. For example, as shown in FIG. 3, a first getter material 172 is disposed in alternating arrangement with the second getter material 173.

A controller 176 is connected to a temperature control element to selectively activate the getter materials 172, 173 to achieve selective adsorption of a particular gas. Preferably, the temperature control element comprises a first set of temperature control elements 174a disposed in thermal communication with the first getter material 172 and a second set of temperature control element 174b is disposed in thermal communication with the second getter material 173. The controller 176 selectively controls the getter materials such that the first getter material is regulated at a first temperature to selectively adsorb a first gas, while the second getter material is regulated at a second temperature to selectively adsorb a second gas. Alternatively, temperature control element comprises a resistive heating element ring that is activated to heat the getter materials 172, 173 to a desired temperature. The invention contemplates a variety of temperature control schemes along with combinations of different getter materials to achieve adsorption of particular undesirable gases. By providing individual control or group control of various getter materials, the invention provides the flexibility to selectively adsorb a variety of gases during the deposition process.

Referring still to FIG. 3, gas analyzer 178 is preferably disposed within the process cavity and connected to the controller 176 to provide signals to the controller 176 to indicate the presence of certain undesirable gases. For example, when the gas analyzer 178 detects the presence of hydrogen and water vapor, the analyzer 178 sends signals to the controller 176 indicating the presence of both hydrogen and water vapor. The controller 176 then responds by heating a first getter material 172 to a temperature that causes adsorption of hydrogen and heating a second getter material 173 to a temperature that causes adsorption of water vapor. Thus, both hydrogen and water vapor are removed from the process cavity by the getter 170.

The following describes a typical wafer processing conducted in the chamber illustrated in FIG. 1. In operation, a substrate 116 is transferred on a robot blade (not shown) into the chamber 100 through the slit valve 115 and positioned above the substrate support 106. The lift pin assembly 120 moves up and lifts the substrate 116 above the robot blade, and the robot blade retracts out of the chamber 100. The slit valve 115 closes to provide a sealed environment, and the chamber 100 is pumped down to a chamber pressure below a few (<10) mTorr by a vacuum pump connected to the gas exhaust 110. The substrate support 106 is moved up by the substrate support lift assembly 118 into the process position. As the substrate support 106 moves up, the substrate 116 is positioned onto the substrate support 106 and subsequently engages the clamp ring 134. Argon is introduced into the chamber through the gas inlet 108 and a plasma is struck within the process cavity 146 by applying an RF bias from the power source 152 to the target 104. The sputtered material from the target 104 is deposited onto the surface of the substrate 116. Preferably, the pressure within the process cavity 146 is maintained between about 10 mTorr and about 100 mTorr while the pressure between the outside of the lower shield 132 and the chamber enclosure is maintained between about 3 mTorr and 10 mTorr. The temperature of the substrate 116 during processing is preferably maintained at about 400° C.

During the deposition process, the getter material 162 is heated to a temperature to selectively adsorb one or more particular undesirable gases. Preferably, the gas analyzer 168 sends signals to the controller 166 to indicate the presence of certain undesirable gases, and the controller 166 responds by heating the getter material 162 to a particular temperature that allows adsorption of these gases. For example, in a chamber having a Zr—Ti alloy as the getter material, when hydrogen is detected in the process cavity, the gas analyzer 168 sends a signal to the controller 166 representing the presence of hydrogen, and the controller 166 heats the getter material 162 to a temperature between about 25° C. and about 300° C. that adsorbs hydrogen. When water vapor is detected by the gas analyzer 168, the controller 166 heats the getter material 162 to a temperature between about 300° C. and about 450° C. that adsorbs water vapor.

The advantages of the present invention include the removal of undesirable gases from the process cavity and the improvements to the resulting deposited film. The invention further provides the advantage of selectively adsorbing a variety of undesirable gases by an in-situ getter made of different getter materials and separate temperature control of the different getter materials. The getter improves the properties of the deposited film by removing the undesirable gases before they are able to reach and contaminate the substrate surface.

While the foregoing is directed to the preferred embodiment of the present invention, other and further embodiments of the invention may be devised without departing from the basic scope thereof, and the scope thereof is determined by the claims that follow.

What is claimed is:

1. An apparatus for removing an undesirable gas in a processing chamber, comprising:
 a) one or more getter materials disposed on an inner surface of a shield surrounding a process cavity between a process gas inlet and a substrate support member in the processing chamber; and b) one or more temperature control elements disposed in thermal communication with the one or more getter materials.

2. The apparatus of claim 1 further comprising:

a target disposed opposite the substrate support member in the processing chamber.

3. The apparatus of claim 2 wherein the one or more getter materials are disposed adjacent a dark space region between the shield and a target within the processing chamber.

4. The apparatus of claim 2 wherein the one or more getter materials comprise a coating disposed on an annular portion of the shield adjacent the processing gas inlet.

5. The apparatus of claim 1 wherein the one or more temperature control elements comprise a plurality of heat lamps disposed on a sidewall of the chamber.

6. The apparatus of claim 1 wherein the one or more temperature control elements comprise an annular resistive heating element.

7. The apparatus of claim 1, further comprising:

c) a controller connected to the one or more temperature control elements to regulate the temperature of the one or more getter materials.

8. The apparatus of claim 7, further comprising:

d) a gas analyzer disposed in the chamber and connected to the controller to provide a signal indicating presence of an undesirable gas in the processing chamber.

9. An apparatus for processing a substrate, comprising:

a) a vacuum processing chamber;

b) a substrate support member disposed in the chamber;

c) a gas inlet connected to the chamber;

d) a gas exhaust connected to the chamber;

e) a shield having one or more getter materials disposed on an inner surface of the shield, the shield surrounding a process cavity between the gas inlet and the substrate support member in the processing chamber; and f) one or more temperature control elements disposed in thermal communication with the one or more getter materials.

10. The apparatus of claim 9, further comprising:

g) a target disposed opposite the substrate support member in the chamber; wherein the one or more getter materials are disposed adjacent a dark space region between the target and the substrate support member.

11. The apparatus of claim 9, further comprising:

g) a controller connected to the one or more temperature control elements to regulate the temperature of the one or more getter materials.

12. The apparatus of claim 11, further comprising:

h) a gas analyzer disposed in the chamber and connected to the controller to provide a signal indicating presence of an undesirable gas in the processing chamber.

13. A method for removing a gas from a processing chamber, comprising:

a) pumping the gas utilizing a getter material disposed on an inner surface of a shield disposed between a process gas inlet and a substrate support member in the processing chamber, wherein the getter material is activated by a temperature control element disposed in thermal communication with the getter material.

14. The method of claim 13, further comprising:

b) detecting a presence of the gas within the processing chamber; and c) controlling the pumping of the getter material based on detection of the presence of the gas.

15. The method of claim 13, further comprising:

b) heating the getter material to a first gas removal temperature.

16. The method of claim 15, further comprising:

c) heating the getter material to a second gas removal temperature to remove a second gas.

17. The method of claim 13, wherein the getter material comprises first and second getter materials, and the method further comprises:

b) heating the first getter material to a first gas removal temperature; and c) heating the second getter material to a second gas removal temperature.

18. The method of claim 17, further comprising:

d) detecting a presence of a first gas and a second gas within the processing chamber; and e) separately controlling temperatures of the first and second getter materials based on detection of the presence of the first and second gases.

* * * * *

UNITED STATES PATENT AND TRADEMARK OFFICE
CERTIFICATE OF CORRECTION

PATENT NO. : 6,241,477 B1
DATED : June 5, 2001
INVENTOR(S) : Brezoczky et al.

It is certified that error appears in the above-identified patent and that said Letters Patent is hereby corrected as shown below:

<u>Column 3,</u>
Line 29, please replace "presence of the a" with -- presence of the --.

Signed and Sealed this

Twenty-sixth Day of February, 2002

Attest:

Attesting Officer

JAMES E. ROGAN
*Director of the United States Patent and Trademark Office*